(12) United States Patent
Yen et al.

(10) Patent No.: US 9,775,269 B2
(45) Date of Patent: Sep. 26, 2017

(54) ELECTRONIC APPARATUS AND ELECTROMAGNETIC RADIATION SUPPRESSION METHOD

(71) Applicant: Realtek Semiconductor Corp., HsinChu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 51 days.

(21) Appl. No.: 14/876,835

(22) Filed: Oct. 7, 2015

(65) Prior Publication Data

US 2016/0113159 A1 Apr. 21, 2016

(30) Foreign Application Priority Data

Oct. 21, 2014 (TW) .............................. 103136312 A

(51) Int. Cl.
*H05K 9/00* (2006.01)
*H05K 1/02* (2006.01)
(Continued)

(52) U.S. Cl.
CPC ....... *H05K 9/0071* (2013.01); *H01L 23/5227* (2013.01); *H03H 1/0007* (2013.01); *H05K 1/0216* (2013.01); *H01L 2924/0002* (2013.01)

(58) Field of Classification Search
CPC ........ H01L 23/5227; H01L 2924/0002; H05K 9/0071; H05K 1/0216; H03H 1/0007
(Continued)

(56) References Cited

U.S. PATENT DOCUMENTS

| 7,122,881 B2 * | 10/2006 | Tsukamoto | ........... H01L 23/552 257/501 |
| 2013/0221499 A1 * | 8/2013 | Karikalan | ............. H01L 23/481 257/659 |

FOREIGN PATENT DOCUMENTS

| TW | 201118432 A1 | 6/2011 |
| TW | 201405758 A | 2/2014 |

* cited by examiner

*Primary Examiner* — Benny Lee
*Assistant Examiner* — Jorge Salazar, Jr.
(74) *Attorney, Agent, or Firm* — Winston Hsu

(57) ABSTRACT

An electronic apparatus includes an electromagnetic radiation source structure and an electromagnetic radiation suppression structure. The electromagnetic radiation source structure is formed in at least one first semiconductor die. The electromagnetic radiation suppression structure is formed in a second semiconductor die, and is used for generating an inverse electromagnetic radiation against the electromagnetic radiation emission of the electromagnetic radiation source structure by sensing the electromagnetic radiation emission of the electromagnetic radiation source structure, to suppress the electromagnetic radiation emission of the electromagnetic radiation source structure from passing through the electromagnetic radiation suppression structure. Another electronic apparatus includes an electromagnetic radiation source structure and an electromagnetic radiation suppression structure. The electromagnetic radiation suppression structure is formed in a printed circuit board. The electromagnetic radiation source structure is formed in a semiconductor die. Associated electromagnetic radiation suppression methods are also disclosed.

18 Claims, 5 Drawing Sheets

(51) Int. Cl.
*H03H 1/00* (2006.01)
*H01L 23/522* (2006.01)
(58) Field of Classification Search
USPC .................... 333/12, 185; 336/200; 257/659
See application file for complete search history.

ELECTRONIC APPARATUS AND ELECTROMAGNETIC RADIATION SUPPRESSION METHOD

BACKGROUND OF THE INVENTION

1. Field of the Invention

The disclosed embodiments of the invention relate to electromagnetic radiation suppression methods, and more particularly, to LC tank electromagnetic radiation suppression methods and associated apparatuses.

2. Description of the Prior Art

Electronic products emit electromagnetic radiation when powered on and operating. This electromagnetic radiation may interfere with the normal operation of neighboring electronic products and may also affect public health. As a result, most countries have set Electromagnetic Interference (EMI) regulations on electronic products.

The integrated circuit (IC) is a major electromagnetic radiation source, especially the inductor inside an IC. The electromagnetic radiation emitted by the inductor not only interferes with external electronic devices, but also with internal components' operation. When a differential mode LC tank has mismatched equivalent inductance between the positive and negative terminals, a common mode signal emerges from the junction of the positive and negative terminals. The common mode signal then wanders on metal lines electrically connected to the junction and induces electromagnetic radiation.

As a result, how to reduce the differential and common mode electromagnetic radiation of the LC tank without affecting performance and reduce the mismatch between the positive and negative terminals of the differential mode LC tank has become an issue in the field.

SUMMARY OF THE INVENTION

One of the objectives of the invention is therefore to disclose LC tank electromagnetic radiation suppression methods and associated apparatuses in response to the aforementioned issues.

According to a first aspect of the invention, an electronic apparatus is disclosed. The electronic apparatus comprises: an electromagnetic radiation source structure, formed in at least one first semiconductor die; and an electromagnetic radiation suppression structure, formed in a second semiconductor die, and used for generating an inverse electromagnetic radiation against electromagnetic radiation emission of the electromagnetic radiation source structure in response to sensed electromagnetic radiation emission of the electromagnetic radiation source structure. This structure can prevent electromagnetic radiation from passing through the electromagnetic radiation suppression structure.

According to a second aspect of the invention, an electronic apparatus is disclosed. The electronic apparatus comprises: an electromagnetic radiation suppression structure, formed in a printed circuit board; and an electromagnetic radiation source structure, formed in a semiconductor die; wherein the electromagnetic radiation suppression structure is used for generating an inverse electromagnetic radiation against electromagnetic radiation emission of the electromagnetic radiation source structure in response to sensed electromagnetic radiation emission of the electromagnetic radiation source structure, to thereby prevent electromagnetic radiation from passing through the electromagnetic radiation suppression structure.

According to a third aspect of the invention, an electromagnetic radiation suppression method is disclosed. The electromagnetic radiation suppression method comprises: forming an electromagnetic radiation suppression structure in a second semiconductor die; and utilizing the electromagnetic radiation suppression structure to generate an inverse electromagnetic radiation against electromagnetic radiation emission of an electromagnetic radiation source structure formed in at least one first semiconductor die in response to sensed electromagnetic radiation emission of the electromagnetic radiation source structure. This method prevents the electromagnetic radiation from passing through the electromagnetic radiation suppression structure.

According to a fourth aspect of the invention, an electronic radiation suppression method is disclosed. The electronic radiation suppression method comprises: forming an electromagnetic radiation suppression structure in a printed circuit board; and utilizing the electromagnetic radiation suppression structure to generate an inverse electromagnetic radiation against electromagnetic radiation emission of an electromagnetic radiation source structure formed in a semiconductor die in response to sensed electromagnetic radiation emission of the electromagnetic radiation source structure, in order to prevent the electromagnetic radiation from passing through the electromagnetic radiation suppression structure.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
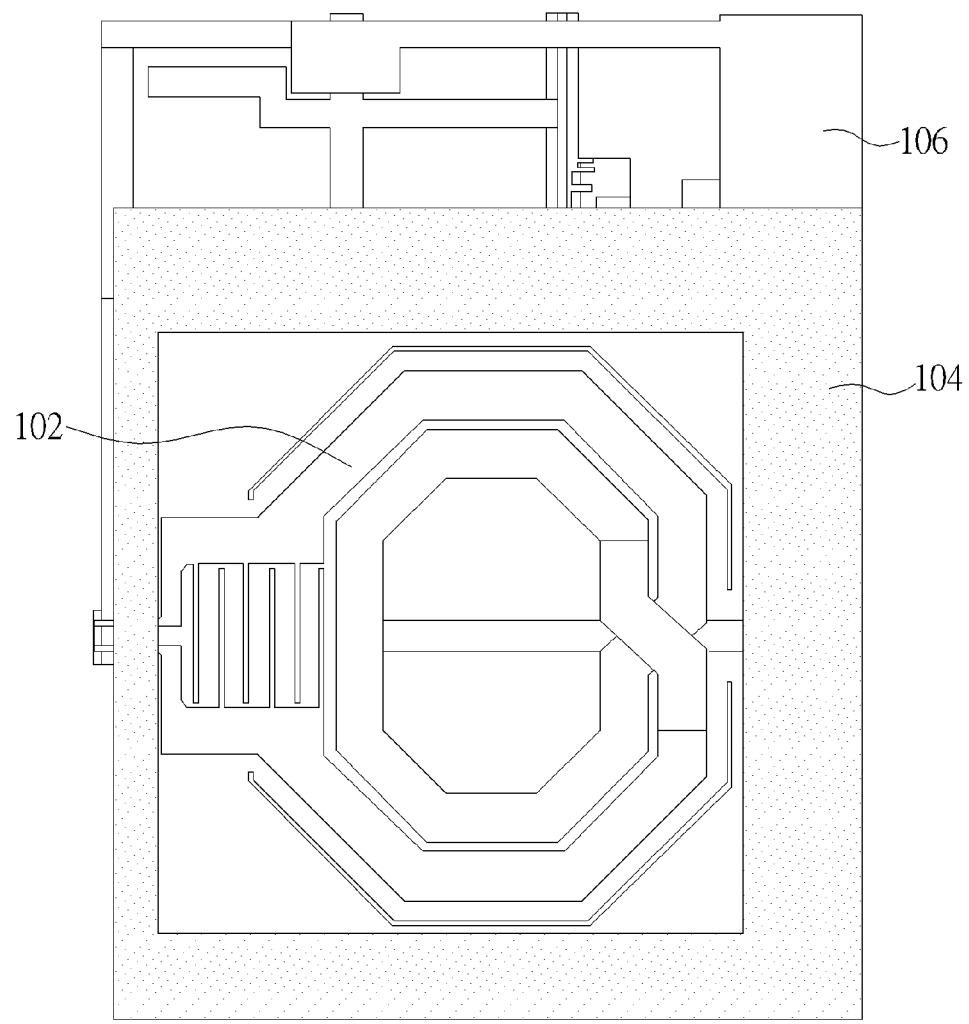
FIG. 1 is a diagram illustrating an LC tank electromagnetic radiation suppression circuit according to an exemplary embodiment of the invention.

FIG. 1 is a diagram illustrating an LC tank electromagnetic radiation suppression circuit according to an exemplary embodiment of the invention. An LC tank 102 (and pertinent wires) and a reference voltage node 106 are disposed in a first semiconductor die. The reference voltage node 106 may connect to a low dropout linear regulator (LDO), but this is not a limitation of the invention. An electromagnetic radiation suppression structure 104 is disposed in a second semiconductor die. The first semiconductor die and the second semiconductor die form a 3D IC stacking architecture. The electromagnetic radiation suppression structure 104 is designed as a rectangular ring structure, and the electromagnetic radiation suppression structure 104 in the second semiconductor die is coupled to the reference voltage node 106 of the first semiconductor die.

Figure 2:
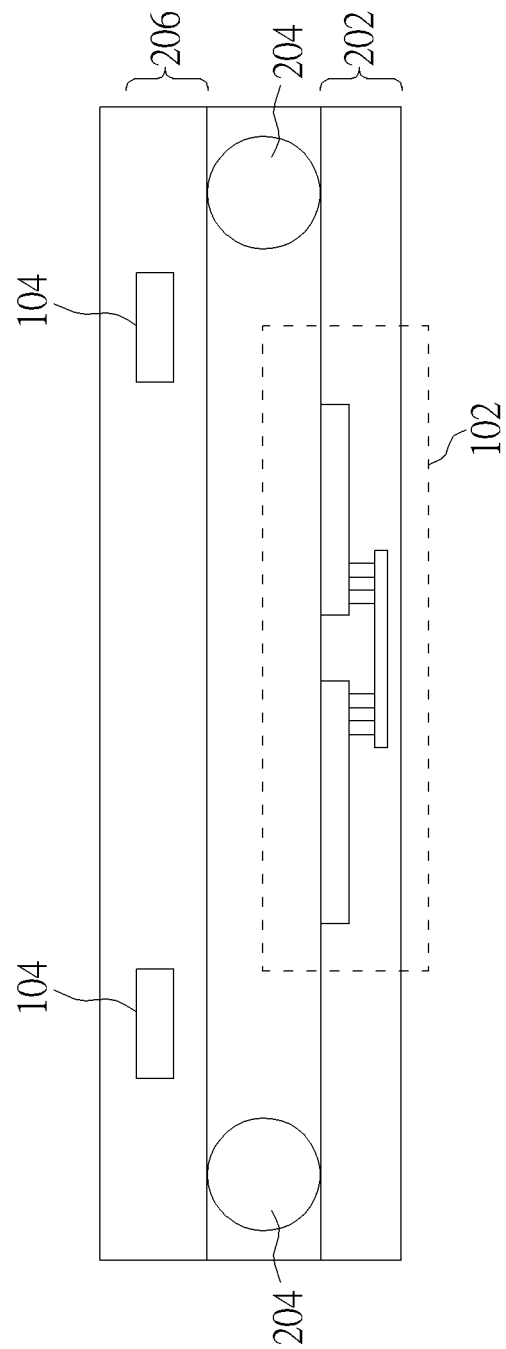
FIG. 2 is a diagram illustrating a cross-sectional view of the LC tank electromagnetic radiation suppression circuit of FIG. 1.

FIG. 2 is a diagram illustrating a cross-sectional view of the LC tank electromagnetic radiation suppression circuit of FIG. 1. It is explicitly shown that the electromagnetic radiation suppression structure 104 is located in a second semiconductor die 206 and that the LC tank 102 is located in a first semiconductor die 202 below the second semiconductor die 206. The first semiconductor die 202 and the second semiconductor die 206 are mutually coupled via a plurality of solder bumps 204 to construct the 3D IC stacking architecture. The remaining space between the first semiconductor die 202 and the second semiconductor die 206 are filled with filler. Note that despite the reference voltage node 106 not being shown in FIG. 2, those skilled in the art should readily understand the electromagnetic radiation suppression structure 104 in the second semiconductor die 206 may be coupled to the reference voltage node 106 in the first semiconductor die 202 via the solder bumps 204.

Specifically, according to Lenz's law, when the LC tank 102 directly/indirectly emits electromagnetic radiation and the electromagnetic radiation passes through the electromagnetic radiation suppression structure 104, an inverse magnetic field will be induced on the electromagnetic radiation suppression structure 104 to actively suppress the electromagnetic radiation. In this way, the overall electromagnetic radiation passing through the rectangular ring is reduced. By properly configuring the distance between four edges of the rectangular ring and the outer inductor of the LC tank 102, electromagnetic radiation of the LC tank 102 can be further reduced without affecting the performance. In addition, the mismatch of the LC tank 102 can be substantially improved. For instance, the distance between four edges of the rectangular ring and the outer inductor of the LC tank 102 is 50 μm. The 3D stacking architecture provides another advantage that the first semiconductor die 202 and the second semiconductor die 204 can be divided by a certain space, meaning the parasitic capacitance effect around the electromagnetic radiation suppression structure 104 is alleviated compared to conventional designs. In this way, it is more possible to implement the electromagnetic radiation suppression structure 104 by a low-end semiconductor manufacturing process, and implement the LA tank 102 by a high-end semiconductor manufacturing process.

Figure 3:
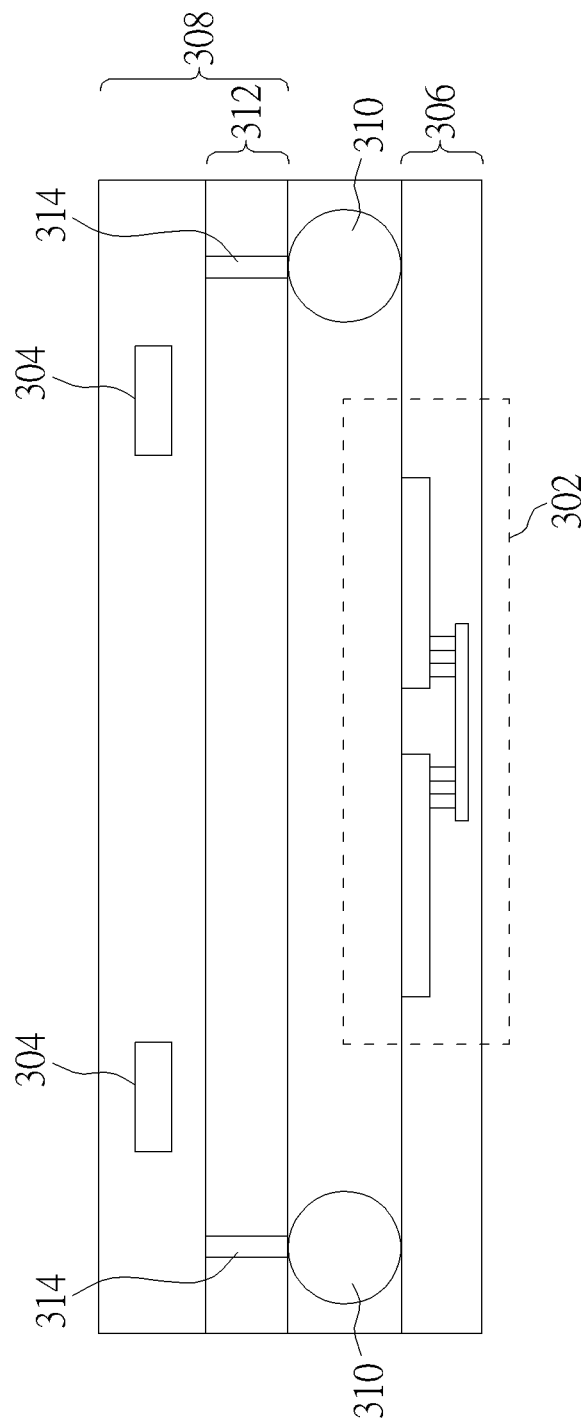
FIG. 3 is a diagram illustrating a cross-sectional view of an LC tank electromagnetic radiation suppression circuit according to another exemplary embodiment of the invention.

FIG. 3 is a diagram illustrating a cross-sectional view of an LC tank electromagnetic radiation suppression circuit according to another exemplary embodiment of the invention. It is explicitly shown that an electromagnetic radiation suppression structure 304 is located in a second semiconductor die 308 and an LC tank 302 is located in a first semiconductor die 306 below the second semiconductor die 308. The first semiconductor die 306 and the second semiconductor die 308 are mutually coupled via a plurality of solder bumps 310 to construct the 3D IC stacking architecture. The remaining space between the first semiconductor die 306 and the second semiconductor die 308 are filled with filler. There is another semiconductor layer 312 between the electromagnetic radiation suppression structure 304 and the solder bumps 310. The electromagnetic radiation suppression structure 304 is coupled to the solder bumps 310 by passing through a plurality of Through Silicon Vias (TSV) 312. Note that, despite a reference voltage node not being shown in FIG. 3, those skilled in the art should readily understand that the electromagnetic radiation suppression structure 304 in the second semiconductor die 308 may be coupled to the reference voltage node in the first semiconductor die 306 via the TSVs 314 and the solder bumps 310.

The LC tank 102 and/or 302 itself is not limited to be disposed in a same die. In an alternative design, an inductor part and a capacitor of an LC tank are located in different dies, wherein the dies are coupled to each other via TSVs or solder bumps, for instance. This is not a limitation of the invention; further, the number of solder bumps is also not limited; and bonding wire may be applied for electrical connection.

The electromagnetic radiation suppression structure 104 and/or 304 is not limited to a rectangular ring shape. In an alternative design, an electromagnetic radiation suppression structure in a circular ring shape may be employed to replace the above. The specific geometrical shape is not limited except that it must be closed. The inner region surrounded by the closed electromagnetic radiation suppression structure 104 and/or 304 may be larger or smaller than the region of the LC tank 102 and/or 302.

The electromagnetic radiation suppression structure 104 and/or 304 may be coupled to a reference voltage node different from the reference node coupled to the LC tank 102 and/or 302; the electromagnetic radiation suppression structure 104 and/or 304 may be completely not coupled to any reference voltage node.

The spatial relationship between the above electromagnetic radiation suppression structure 104 and/or 304 and the LC tank 102 and/or 302 is not limited to the mentioned embodiments. In an alternative design, an electromagnetic radiation suppression structure may be intentionally placed farther from an LC tank compared with FIG. 2 and FIG. 3, and another semiconductor die may be further disposed between a die where the electromagnetic radiation suppression structure is disposed and a die where the LC tank is disposed, to form a 3D stacking structure. The stacking architecture and the number of semiconductor layers between the two dies are not limited in the invention. For instance, 2.5D IC stacking structure also falls within the scope of the invention. Consequently, those skilled in the art should readily understand that different dies may be implemented by the same or different semiconductor process. In an alternative design, an electromagnetic radiation suppression structure is disposed in another semiconductor die below a die where an LC tank is located. In other embodiment of the invention, an electromagnetic radiation suppression structure is located in a semiconductor die below a die where an LC tank is located to avoid electromagnetic radiation emitted downward from the LC tank through holes on a printed circuit board (PCB); alternatively, an electromagnetic radiation suppression structure may be disposed on a PCB below a die where an LC tank is located.

The above electromagnetic radiation suppression structure 104 and/or 304 may be applied to other cases. For example, an electromagnetic radiation suppression structure may be used to suppress electromagnetic radiation induced from an inductor based transformer. The electromagnetic radiation suppression structure has a closed polygonal ring structure which may surround an inner region including merely the LC tank layout or a broader region, e.g. the region including more metal wires and other components. For instance, the inner region includes at least an inductor or a transformer.

Figure 4:
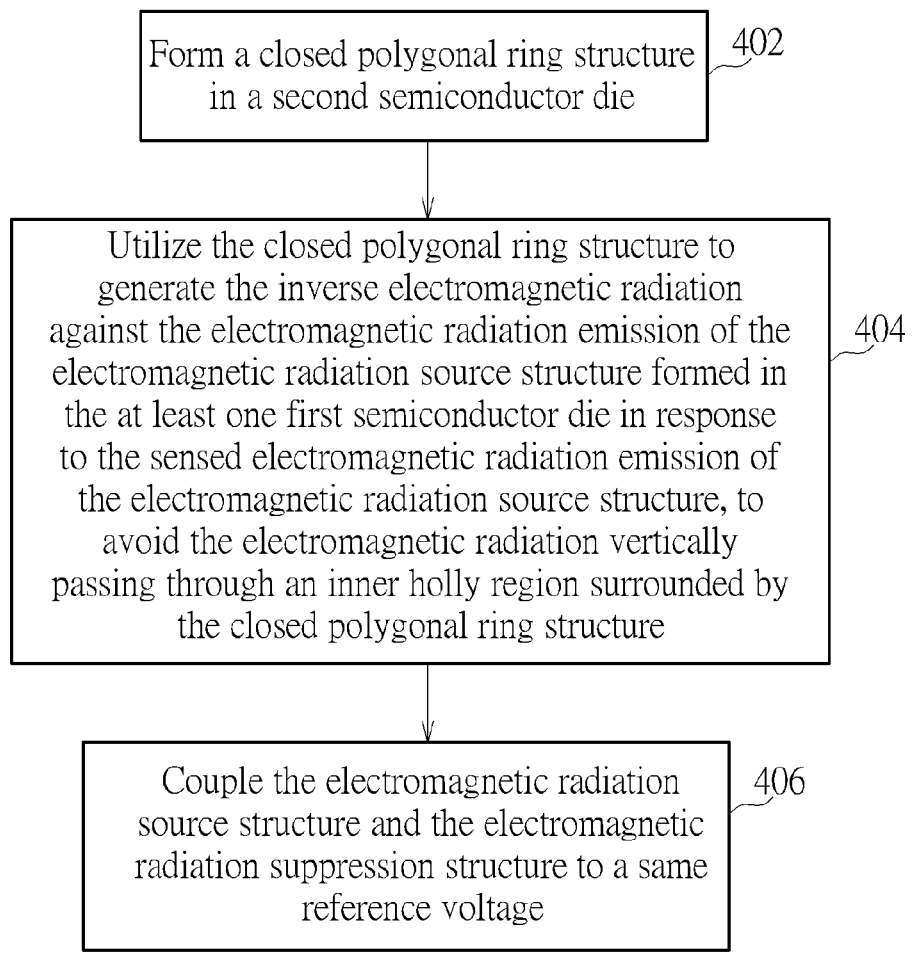
FIG. 4 is a diagram illustrating an electromagnetic radiation suppression method according to a first embodiment of the invention.

FIG. 4 is a diagram illustrating an electromagnetic radiation suppression method according to a first embodiment of the invention. Provided that substantially the same result is achieved, the steps of the flowchart shown in FIG. 4 need not be in the exact order shown and need not be contiguous; that is, other steps can be intermediate. Some steps in FIG. 4 may be omitted according to various embodiments or requirements. The electromagnetic radiation suppression method is briefly summarized as follows.

402: form a closed polygonal ring structure in a second semiconductor die;

404: utilize the closed polygonal ring structure to generate the inverse electromagnetic radiation against the electromagnetic radiation emission of the electromagnetic radiation source structure formed in the at least one first semiconductor die in response to the sensed electromagnetic radiation emission of the electromagnetic radiation source structure, to prevent electromagnetic radiation from vertically passing through an inner region surrounded by the closed polygonal ring structure; and 406: couple the electromagnetic radiation source structure and the electromagnetic radiation suppression structure to a same reference voltage.

Figure 5:
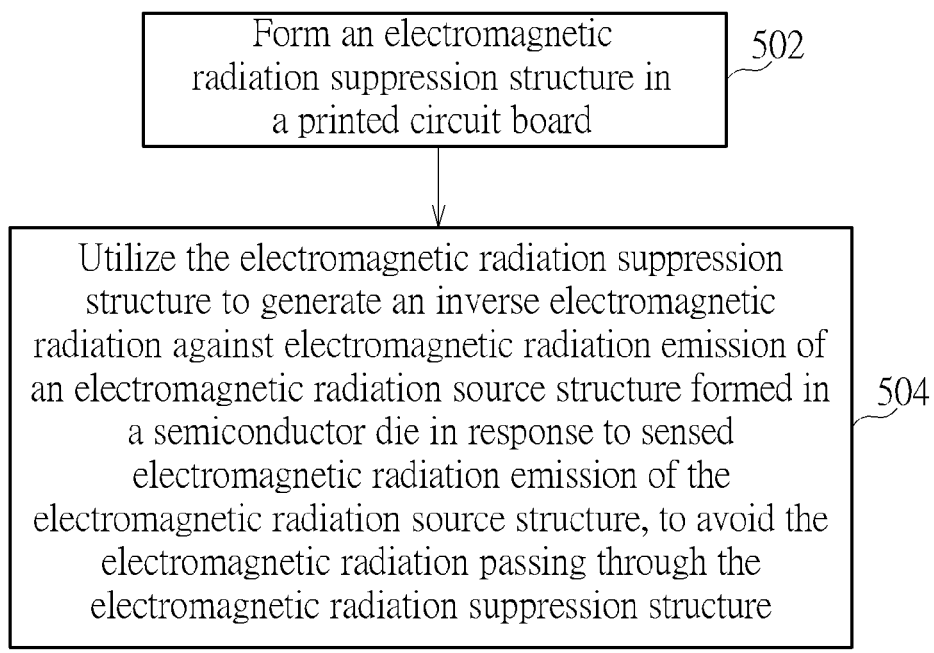
FIG. 5 is a diagram illustrating an electromagnetic radiation suppression method according to a second embodiment of the invention.

FIG. 5 is a diagram illustrating an electromagnetic radiation suppression method according to a second embodiment of the invention. Provided that substantially the same result is achieved, the steps of the flowchart shown in FIG. 5 need not be in the exact order shown and need not be contiguous; that is, other steps can be intermediate. Some steps in FIG. 5 may be omitted according to various embodiments or requirements. The electromagnetic radiation suppression method is briefly summarized as follows.

502 form an electromagnetic radiation suppression structure in a printed circuit board; and 504: utilize the electromagnetic radiation suppression structure to generate an inverse electromagnetic radiation against electromagnetic radiation emission of an electromagnetic radiation source structure formed in a semiconductor die in response to sensed electromagnetic radiation emission of the electromagnetic radiation source structure, to prevent the electromagnetic radiation from passing through the electromagnetic radiation suppression structure.

In particular, it is envisaged that the aforementioned inventive concept can be applied by a semiconductor manufacturer to any integrated circuit. It is further envisaged that a semiconductor manufacturer may employ the inventive concept in the design of a stand-alone device, or application-specific integrated circuit (ASIC) and/or any other subsystem element.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, improved electromagnetic radiation suppression structures and associated methods have been described, wherein the aforementioned disadvantages with prior art arrangements have been substantially alleviated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic apparatus, comprising:
an electromagnetic radiation source structure, formed in at least one first semiconductor die, wherein the electromagnetic radiation source structure is an inductor-based circuit; and
an electromagnetic radiation suppression structure, formed in a second semiconductor die, wherein the electromagnetic radiation suppression structure comprises a ring structure and is used for generating an inverse electromagnetic radiation against electromagnetic radiation emission of the electromagnetic radiation source structure in response to sensed electromagnetic radiation emission of the electromagnetic radiation source structure, to prevent electromagnetic radiation from passing through the electromagnetic radiation suppression structures;
wherein the at least one first semiconductor die and the second semiconductor die form a three-dimensional (3D) stacking structure.

2. The electronic apparatus of claim 1, wherein the electromagnetic radiation source structure comprises a first partial structure and a second partial structure, the first partial structure is disposed in the first semiconductor die, and the second partial structure is disposed in a third semiconductor die.

3. The electronic apparatus of claim 1, wherein the ring structure is a closed polygonal ring structure.

4. The electronic apparatus of claim 3, wherein the electromagnetic radiation emission of the electromagnetic radiation source structure vertically passes through an inner region surrounded by the closed polygonal ring structure.

5. The electronic apparatus of claim 1, wherein the ring structure is a closed circular ring structure.

6. The electronic apparatus of claim 5, wherein the electromagnetic radiation emission of the electromagnetic radiation source structure vertically passes through an inner region surrounded by the closed circular ring structure.

7. The electronic apparatus of claim 1, wherein the electromagnetic radiation source structure and the electromagnetic radiation suppression structure are coupled to a same reference voltage.

8. The electronic apparatus of claim 1, wherein the electromagnetic suppression structure is not coupled to any reference voltages to which the electromagnetic radiation source structure is coupled.

9. The electronic apparatus of claim 1, wherein a third semiconductor die is disposed between the at least one first semiconductor die and the second semiconductor die, and the at least one first semiconductor die is coupled to the second semiconductor die via the third semiconductor die.

10. An electronic apparatus, comprising:
an electromagnetic radiation suppression structure, formed in a printed circuit board; and an electromagnetic radiation source structure, formed in a semiconductor die, wherein the electromagnetic radiation source structure is an inductor-based circuit;
wherein the electromagnetic radiation suppression structure comprises a ring structure and is used for generating an inverse electromagnetic radiation against electromagnetic radiation emission of the electromagnetic radiation source structure in response to sensed electromagnetic radiation emission of the electromagnetic radiation source structure, to prevent electromagnetic radiation from passing through the electromagnetic radiation suppression structure;
wherein the at least one first semiconductor die and the second semiconductor die form a three-dimensional (3D) stacking structure.

11. An electromagnetic radiation suppression method, comprising:
forming an electromagnetic radiation suppression structure in a second semiconductor die, wherein the electromagnetic radiation suppression structure comprises a ring structure; and
utilizing the electromagnetic radiation suppression structure to generate an inverse electromagnetic radiation against electromagnetic radiation emission of an inductor-based circuit comprised in an electromagnetic radiation source structure formed in at least one first semiconductor die in response to sensed electromagnetic radiation emission of the electromagnetic radiation source structure, to prevent electromagnetic radiation from passing through the electromagnetic radiation suppression structure;
wherein the at least one first semiconductor die and the second semiconductor die form a three-dimensional (3D) stacking structure.

12. The electromagnetic radiation suppression method of claim 11, wherein the step of utilizing the electromagnetic radiation suppression structure to generate the inverse electromagnetic radiation comprises:
utilizing the electromagnetic radiation suppression structure to generate the inverse electromagnetic radiation against the electromagnetic radiation emission of a first partial structural of the electromagnetic radiation source structure formed in the at least one first semiconductor die and a second partial structural of the electromagnetic radiation source structure formed in a third semiconductor die in response to the sensed electromagnetic radiation emission of the electromagnetic radiation source structure.

13. The electromagnetic radiation suppression method of claim 11, wherein the step of forming the electromagnetic radiation suppression structure in the second semiconductor die comprises:
forming the ring structure, wherein the ring structure is a closed polygonal ring structure in the second semiconductor die.

14. The electromagnetic radiation suppression method of claim 13, wherein the step of utilizing the electromagnetic radiation suppression structure to generate the inverse electromagnetic radiation comprises:
utilizing the closed polygonal ring structure to generate the inverse electromagnetic radiation against the electromagnetic radiation emission of the electromagnetic radiation source structure formed in the at least one first semiconductor die in response to the sensed electromagnetic radiation emission of the electromagnetic radiation source structure, to prevent electromagnetic radiation from vertically passing through an inner hole-shape region surrounded by the closed polygonal ring structure.

15. The electromagnetic radiation suppression method of claim 11, wherein the step of forming the electromagnetic radiation suppression structure in the second semiconductor die comprises:
forming the ring structure, wherein the ring structure is a closed circular ring structure in the second semiconductor die.

16. The electromagnetic radiation suppression method of claim 15, wherein the step of utilizing the electromagnetic radiation suppression structure to generate the inverse electromagnetic radiation comprises:
utilizing the closed circular ring structure to generate the inverse electromagnetic radiation against the electromagnetic radiation emission of the electromagnetic radiation source structure formed in the at least one first semiconductor die in response to the sensed electromagnetic radiation emission of the electromagnetic radiation source structure, to prevent electromagnetic radiation from vertically passing through an inner hole-shape region surrounded by the closed circular ring structure.

17. The electromagnetic radiation suppression method of claim 11, further comprising:
coupling the electromagnetic radiation source structure and the electromagnetic radiation suppression structure to a same reference voltage.

18. The electromagnetic radiation suppression method of claim 11, further comprising:
not coupling the electromagnetic suppression structure to any reference voltages to which the electromagnetic radiation source structure is coupled.

* * * * *